US009103862B2

(12) United States Patent
Cozza et al.

(10) Patent No.: US 9,103,862 B2
(45) Date of Patent: Aug. 11, 2015

(54) METHOD OF CHECKING THE DIRECTIVITY AND POLARIZATION OF COHERENT FIELD DISTRIBUTIONS IN A REVERBERANT MEDIUM

(75) Inventors: Andrea Cozza, Paris (FR); Mouhamad Houman Moussa, Gif sur Yvette (FR)

(73) Assignee: SUPELEC, Gif-sur-Yvette (FR)

( * ) Notice: Subject to any disclaimer, the term of this patent is extended or adjusted under 35 U.S.C. 154(b) by 689 days.

(21) Appl. No.: 13/262,308

(22) PCT Filed: Mar. 30, 2010

(86) PCT No.: PCT/FR2010/050594
§ 371 (c)(1),
(2), (4) Date: Sep. 30, 2011

(87) PCT Pub. No.: WO2010/112763
PCT Pub. Date: Oct. 7, 2010

(65) Prior Publication Data
US 2012/0017682 A1 Jan. 26, 2012

(30) Foreign Application Priority Data

Mar. 30, 2009 (FR) ...................................... 09 51995

(51) Int. Cl.
*H04R 1/28* (2006.01)
*G01R 31/00* (2006.01)
(Continued)

(52) U.S. Cl.
CPC .......... *G01R 31/002* (2013.01); *G01R 29/0871* (2013.01); *G01R 29/0821* (2013.01); *G01R 31/001* (2013.01); *G01R 31/308* (2013.01); *G01R 35/005* (2013.01); *H03D 7/166* (2013.01)

(58) Field of Classification Search
CPC .......... G01R 29/0871; G01R 29/0821; G01R 31/001; G01R 31/002; G01R 31/308; G01R 35/005; H03D 7/166
USPC .......................................................... 702/104
See application file for complete search history.

(56) References Cited

U.S. PATENT DOCUMENTS 4,864,315 A * 9/1989 Mohuchy ...................... 343/703
5,302,960 A 4/1994 Boers
(Continued)

FOREIGN PATENT DOCUMENTS

WO 2005104473 A 11/2005

OTHER PUBLICATIONS

Kildal et al., "Detection of a Polarization Imbalance in Reverberation Chambers and How To Remove It By Polarization Stirring When Measuring Antenna Efficiencies" Microwave and Optical Technology Letters/vol. 34, No. 2, Jul. 20, 2002.*
Fink, "Time-Reversed Acoustics" Scientific American Nov. 1999.*
Fielitz et al., "Reverberation-Chamber Test Environment for Outdoor Urban Wireless Propagation Studies" IEEE Antennas and Wireless Propagation Letters, vol. 9, 2010.*
(Continued)

*Primary Examiner* — Mohamed Charioui
*Assistant Examiner* — John Kuan
(74) *Attorney, Agent, or Firm* — Young & Thompson

(57) ABSTRACT

A method for generating and checking a spatio-temporal field distribution having predefined characteristics such as one or more directions of propagation, a high level of field intensity and a polarization in a reverberant chamber. To do this, two separate networks of transducers are provided so as to estimate a transfer function between these two networks and to determine excitation signals using the principle of temporal return. The excitation signals are used to generate the spatio-temporal field according to the predefined characteristics.

20 Claims, 3 Drawing Sheets

(51) Int. Cl.
  *H03D 7/16* (2006.01)
  *G01R 29/08* (2006.01)
  *G01R 31/308* (2006.01)
  *G01R 35/00* (2006.01)

(56) References Cited

U.S. PATENT DOCUMENTS

| | | | | |
|---|---|---|---|---|
| 5,982,903 | A * | 11/1999 | Kinoshita et al. | 381/18 |
| 6,768,971 | B1 * | 7/2004 | Sparrow et al. | 702/189 |
| 8,391,500 | B2 * | 3/2013 | Hannemann et al. | 381/18 |
| 2007/0211788 | A1 * | 9/2007 | Fink et al. | 375/146 |
| 2009/0083004 | A1 * | 3/2009 | Ihn et al. | 702/189 |
| 2009/0301198 | A1 * | 12/2009 | Sohn et al. | 73/598 |

OTHER PUBLICATIONS

Corona et al., "Reverberation-Chamber Research-Then and Now: A Review of Early Work and Comparison With Current Understanding" IEEE Transactions on Electromagnetic Compatibility, vol. 44, No. 1, Feb. 2002.*

Bruns et al., "A Closer Look at Reverberation Chambers-3-D Simulation and Experimental Verification" IEEE Transactions on Electromagnetic Compatibility, vol. 47, No. 3, Aug. 2005.*

Christopher L Holloway et al: "On the Use of Reverberation Chambers to Simulate a Rician Radio Environment for the Testing of Wireless Devices", IEEE Transactions on Antennas and Propagation, vol. 54, No. 11, Nov. 1, 2006, pp. 3167-3177, XP011150298.

International Search Report, dated Jun. 7, 2010, in PCT/FR2010/050594.

* cited by examiner

METHOD OF CHECKING THE DIRECTIVITY AND POLARIZATION OF COHERENT FIELD DISTRIBUTIONS IN A REVERBERANT MEDIUM

BACKGROUND OF THE INVENTION

1. Field of the Invention

The present invention relates to a method for generating a spatio-temporal field in a reverberant environment in order to analyse the behaviour of an object under test placed in the reverberant environment. It has a particularly useful application in the detection of immunity failures in objects subjected to electromagnetic emissions or even in the response of objects subjected to a particular field. The present invention can also be applied in the field of acoustics.

2. Description of the Related Art

In general, with the increase in the amount of electronic equipment in current systems, it is becoming essential to verify their susceptibility to radiated emissions.

In order to provide for the simultaneous operation of such pieces of equipment in proximity to one another, it is necessary to verify their ability to operate satisfactorily in their environment without producing any interference which is unacceptable for everything present in that environment. This leads to a need to investigate the response of an object subjected to a field, whether it be a component, a piece of equipment or a complete system, in order to determine the access routes vulnerable to external attacks and counteract such defects.

Thus, obtaining high field levels in the radiofrequency domain while still keeping the cost of measuring instruments as low as possible has become a priority for manufacturers, who are required to verify that the new products they are proposing meet the compatibility standards, requiring numerous tests.

However, these tests may be costly in terms of system downtime, which is reflected in a financial loss when a production line is started up or in terms of the instrumentation and power to be implemented for such tests.

This may result in the object under test being subjected to locally plane waves with well specified characteristics such as a direction of propagation and a polarization, as is the case for tests performed in an anechoic chamber. For this type of directive tests, the number of test configurations is quickly limited, a few directions of arrival at the object under test and two polarizations (horizontal and vertical) being used to minimize the downtime of the systems being tested, since mechanically changing the configuration takes some time. What is more, the generation of a high-intensity field requires the involvement of high power levels, which gives rise to extra cost in terms of equipment and maintenance.

Another solution often used in the prior art is the generation of intense, isotropic and homogeneous fields by means of reverberant chambers with mode mixing. These can be used simultaneously to excite a considerable number of locally plane waves coming from random directions and with different polarizations while still ensuring a high mean field level on the basis of relatively low injected powers. However, they have disadvantages concerning the accuracy of the measurements, which are dependent on the tolerance as regards the uniformity of the field and the random nature of the directions of propagation of the field and its excited polarizations. In fact, the random nature of the attack, although capable of detecting the presence of a fault in a system, cannot be used precisely to identify the origin or the location without performing subsequent tests in an anechoic chamber.

Document WO 2005/104473 A1 is known, which describes the technique of time reversal of a wave and involves the transmission of signals in accordance with a wireless point-to-point communication model with no ability to check the directivity or polarization of the propagation of the wave front.

The purpose of the present invention is to remedy the above-mentioned disadvantages by proposing a method for generating an intense field and checking its directivity, direction of arrival and polarization. Another purpose of the invention is real-time checking of the spatio-temporal distribution of the field produced.

At least one of the above-mentioned objectives is achieved with a method for generating a spatio-temporal field in a reverberant environment in order to analyse the behaviour of an object under test placed in the reverberant environment. The method according to the invention comprises the following steps:

- at least one transfer function between a first group of transducers comprising at least one transducer placed in the reverberant environment and a second group of transducers comprising at least one transducer also placed in the reverberant environment is estimated,
- taking account of the spatial distribution of the transducers of the first group, a spatio-temporal excitation field to be applied to the object is considered,
- primary signals which, when applied to the first group of transducers, make it possible to obtain said spatio-temporal excitation field are modelled,
- said at least one transfer function is applied to these primary signals so as to obtain secondary signals,
- a technique known as time reversal in the time domain or phase conjugation in the frequency domain is used on these secondary signals so as to determine excitation signals, and
- these excitation signals are applied to the transducers of the second group so as to obtain said spatio-temporal excitation field on the object.

The reverberant environment may be a reverberant chamber or an enclosure with a high reflectivity of the walls to incident waves.

Thus, the first group of transducers is used to estimate the transfer functions. On the other hand, this first group is no longer needed during the injection of excitation signals, i.e., for example, during measurements of the electromagnetic compatibility of an object under test. In fact, once the transfer functions have been determined, numerous wave propagation scenarios can be implemented by modifying the excitation signals only, the position of the transducers of the second group remaining identical to their position during estimation.

The method according to the invention involves a learning phase for the initial wave path and focusing of the excitation wave solely on an emission source, as in the prior art. The present invention makes it possible to generate coherent, high-intensity and polarized spatial distributions of the spatio-temporal field in a reverberant environment while still retaining the ability to focus this field anywhere in the reverberant environment.

The invention has a serious advantage with respect to the prior art with regard to the duration of the tests, which is only limited by the physical limits of the test environment, such as, for example, the propagation time of the wave front generated. Thus, a representative test duration of 1 ms allows for 1000 different configurations in one second on the basis of one single initial characterization phase (obtaining transfer functions for a given positioning of the transducers).

According to an advantageous characteristic of the invention, during the modelling stage, each primary signal is defined in the form of $\alpha_j.X$, where X is the frequency spectrum of a signal as a function of the time variation to be obtained; $\alpha$ is a complex coefficient of amplitude and phase weighting for the signal X, and j is an index denoting each transducer of the first group of transducers, these coefficients $\alpha_j$ being defined as a function of the directivity, and/or direction of arrival and/or intensity of the spatio-temporal excitation field and/or the polarization.

Preferably, the $\alpha_j$ are defined in accordance with a technique for synthesizing a network of transducers in free space. More precisely, during estimation of the transfer function, there is a time window where the radiation from the transducers of the first group is propagated under free space conditions during which the wave front emitted has not interacted with the walls of the reverberant environment. The time reversal technique makes it possible to find this time window by transforming the divergent wave front into a wave front converging towards the object under test.

BRIEF SUMMARY OF THE INVENTION

In other words, the present invention makes it possible to consider a spatio-temporal field that it is desired to apply to the object under test; the properties of this spatio-temporal field comprising in particular the intensity, the polarization, the directivity and the direction of arrival. In order to obtain such a spatio-temporal field with given properties, the primary signal to be applied to each transducer of the first group is determined. In particular, this involves a single primary signal but with a different $\alpha_j$ weighting on each transducer of the first group. Knowing the transfer function between the transducers of the first group and the second group, secondary signals which would be detected by the second transducers for a divergent emission of the spatio-temporal field from the transducers of the first group are determined. This is brought about by simulation of the divergent radiation of the spatio-temporal field in free space by means of analytical or numerical models. The reversal technique then makes it possible to determine the excitation signal (weighted by transducer) actually to be applied to the transducers of the second group so as to obtain a spatio-temporal excitation field converging towards the object under test, the properties of this spatio-temporal excitation field being identical to those of the above divergent spatio-temporal field.

Advantageously, during the stage of estimation of at least one transfer function, two transfer functions can be determined for respectively two different orthogonal orientations of said at least one transducer of the first group of transducers, the two orientations being tangent to a surface comprising all of the transducers of the first group of transducers; then, in the modelling stage, a linear combination of the two transfer functions is applied as a function of the desired polarization of the wave front of said spatio-temporal excitation field. It is thus possible to define any type of polarization for the spatio-temporal excitation field, such as for example a linear polarization. Preferably, during the first phase, three transfer functions are determined for respectively three different orthogonal orientations of said at least one transducer of the first group of transducers; then, in the modelling stage, a linear combination of the three transfer functions is applied as a function of the desired polarization of the wave front of said spatio-temporal excitation field. As in the case of two tangent orientations, it is also possible to define any type of polarization for the spatio-temporal excitation field.

With such a method according to the invention, the spatio-temporal excitation field has a wave front with properties which can be modified easily and quickly:
directivity: the directivity of the wave front can be modified in real time with no mechanical and/or electronic movement of the transducers of the second group, since it is enough just to change the signals applied to these transducers. The same applies for the direction of arrival of the wave front,
which is itself in particular linked to the arrangement of the transducers of the first group;
polarization: on the basis of the orthogonality either of three transfer functions in three principal orthogonal directions x, y, z or of two transfer functions with tangent orientations as seen previously, any polarization produced by the linear combination of these three transfer functions can be addressed;
movement of the phase centre of the convergent wave: makes it possible to focus a field on a precise part of the object under test.

Advantageously, the first group of transducers may comprise a plurality of transducers arranged:
in linear fashion,
in surface fashion,
in such a fashion as to constitute a volume around the object under test, for example following the shape of the object.

According to an advantageous embodiment of the invention, the transducers, in particular those of the first group, are as unobtrusive as possible. In fact, this involves components capable of converting an electromagnetic or acoustic signal into an electrical or optical signal. Each transducer of the first group may be an antenna or sensor capable of emitting a spatio-temporal field during determination of the transfer function but capable of being "invisible" during the measurement phases. By invisible is meant offering the least interference possible with respect to the spatio-temporal excitation field generated by the transducers of the second group. Advantageously, the transducers of the first group may be electro-optical or electro-acoustic sensors.

Electro-optical sensors may be based on electro-optical crystals. This does not actually involve antennas. Such an electro-optical sensor operates in such a way that the signal associated with a field detected by this sensor modulates an optical signal, which is then transmitted by optical fibre to a processing unit. This modulation is used as the basis for estimation of the field where the sensor is located.

Electro-optical sensors based on an RF/optical conversion may also be used. In this case, there is an antenna which acts as a sensor and an RF/optical conversion module. The signal detected is converted and then transmitted over optical fibre. A variant of such sensors is the use, in place of the antenna, of an electrical or magnetic field sensor (TEM cells, capacitors, Hall effect sensors, etc.).

According to an embodiment of the invention, during the stage of estimation of at least one transfer function, at least one transducer of the first group can be used and moved into different positions and a component of said at least one transfer function is determined for each different position. In other words, rather than having a network of transducers of the first group, only a single transducer is used for example, which is moved so as to determine the overall transfer function.

As an example, the estimation of said at least one transfer function is obtained in the frequency domain using a network analyzer, in particular a vector network analyzer. Otherwise, the estimation of said at least one transfer function can be obtained in the time domain using a function generator or arbitrary wave form generator and an oscilloscope.

BRIEF DESCRIPTION OF THE DRAWINGS

Other advantages and characteristics of the invention will become apparent on examination of the detailed description of an embodiment which is in no way limitative, and the attached diagrams, in which.

DETAILED DESCRIPTION OF THE PREFERRED EMBODIMENTS

Although the invention is not limited to this, a description will not be Given of the method according to the invention for measurements of the Electromagnetic compatibility of a piece of equipment under test (EUT) placed In a reverberant chamber.

The implementation of this method requires a highly reverberant environment such as for example an enclosure of any shape with walls which have high reflectivity and consequently introduce as few losses as possible. The invention can be used to generate intense, deterministic and coherent fields in a reverberant enclosure usually used for generating intense, but random and non-coherent fields.

Figure 1:
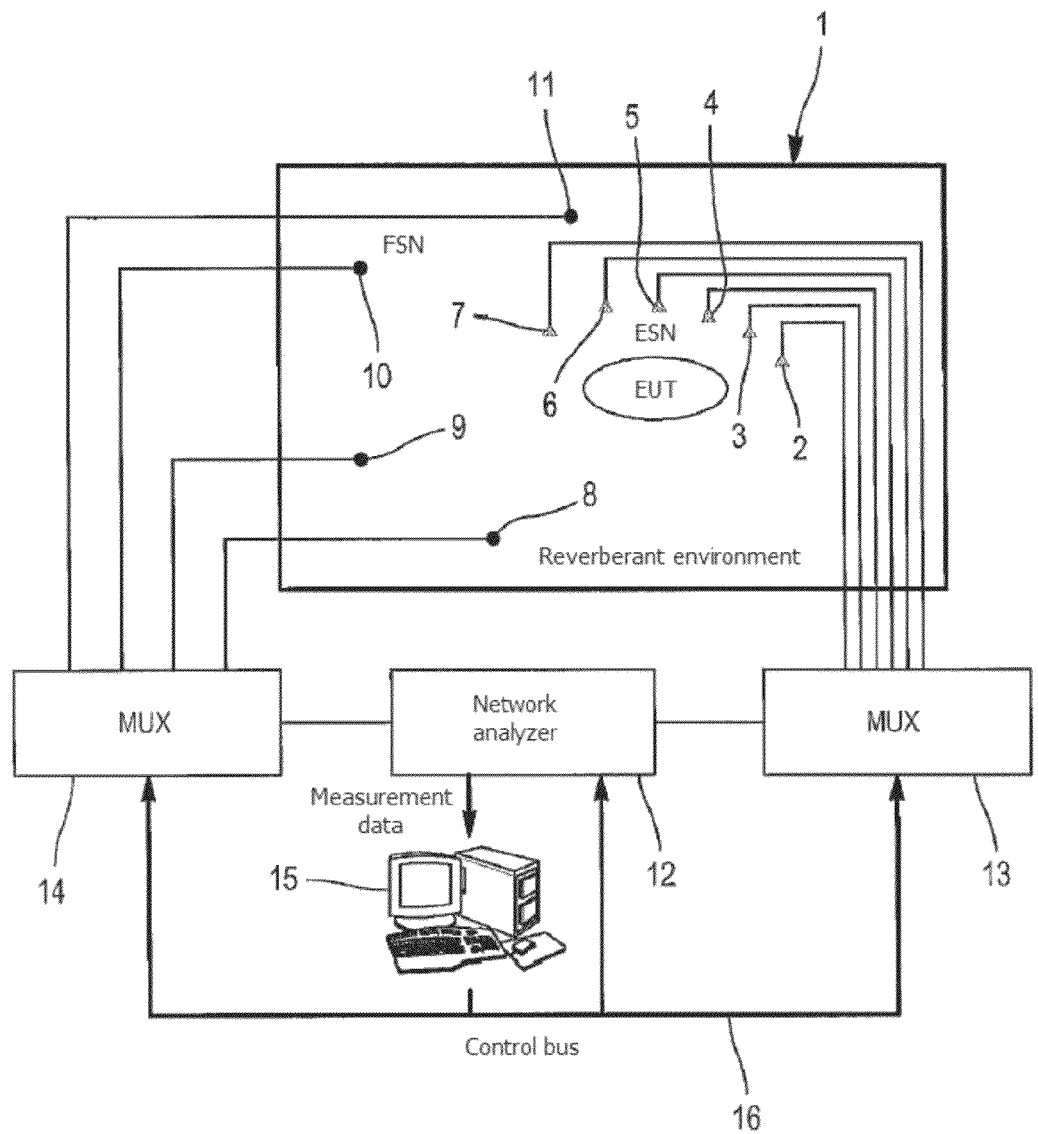
FIG. 1 is a simplified diagram of a configuration for the characterization of the reverberant environment so as to determine transfer functions Hij.

FIG. 1 shows a configuration for characterizing the reverberant environment contained in a chamber 1. There is a collection of transducers providing for the generation or measurement of the field, which can be divided into two distinct families:
- a first group of six transducers 2-7, which define an Equivalent Source Network (ESN) with a surface corresponding to their distribution in the reverberant environment; the ESN emulates the radiation of a point source at the centre of the equipment under test (EUT);
- a second group of four transducers 8-11, which define a Field Synthesis Network (FSN) and which may be arranged on the walls or throughout the volume of the reverberant environment.

According to the invention, passive field diffusers (not shown) may be positioned in order possibly to enhance the performance, but this introduces an additional level of complexity.

The equipment under test EUT may preferentially be present throughout the duration of the test. The purpose of a measurement of electromagnetic compatibility is to attack the equipment under test EUT with coherent wave fronts (pulsed or not) along different directions of arrival. Thus, depending on all the directions envisaged, the spatial configuration of the equivalent sources network ESN is defined.

For example, if one wishes to test the equipment under test EUT on one single side, it is sufficient to define an equivalent sources network ESN in the form of a surface, as in FIG. 1. The transducers 2-7 of the ESN are arranged close to the equipment under test EUT along a concave surface, which partially surrounds the equipment under test EUT. This arrangement is determined so as to generate a wave front to strike the equipment under test EUT in the North-South direction from the ESN network towards the equipment under test EUT at a focal point.

In the event that all directions are to be considered, the equivalent sources network ESN will describe a closed surface forming a volume which will contain the equipment under test EUT.

The degrees of freedom on these configurations are multiple, such as:
- the transverse width of the support (spatial extension) of the wave which impacts (broad/thin) or highly localized focussing,
- the different angles of elevation and azimuths of the wave front generated,
- different polarizations, linear, elliptical, and
- different temporal wave forms.

The method according to the invention comprises a stage of estimating a transfer function, thus making it possible to describe the reverberant environment. Transfer functions $H_{ij}(\omega)$ are determined between each element i of the Field Synthesis Network FSN and each element j of the equivalent sources network ESN. These functions can be measured in time or in frequency with appropriate devices (oscilloscope, vector network analyzer, etc). FIG. 1 shows a network analyzer 12 linked on the one hand to a first multiplexer 13, which is connected to all of the transducers 2-7 of the equivalent sources network ESN and on the other hand to a second multiplexer 14, which is connected to the four transducers 8-11 of the Field Synthesis Network FSN. The measurement data originating from the network analyzer 12 are collected and then processed by a processing unit 15 such as a microcomputer equipped with the capacity and components needed to perform digital processing. A control bus 16 is used for the processing unit 15 to communicate with the two multiplexers 13 and 14 and the network analyzer.

Since the system is reciprocal, either the reverberant environment can be excited by applying a signal of any temporal form through the transducers (antennas) 2-7 of the equivalent sources network ESN one by one and then collecting the signals on the different transducers (antennas) 8-11 in the Field Synthesis Network FSN, or the transducers (antennas) of the Field Synthesis Network FSN can be excited one by one and measured on those in the equivalent sources network ESN. In fact, if a signal $X(\omega)$ is injected (which may be a Gaussian signal or a frequency sweep using sine waves) which presents a non-zero spectral pass band on an antenna i of the Field Synthesis Network FSN, the following is obtained on an antenna j of the equivalent sources network ESN:

$$Y_j(\omega)=X(\omega)H_{ij}(\omega)$$

Similarly, by exciting through the antennas of the ESN, the following signals are obtained on the antennas of the FSN. For example, by exciting through antenna j in the ESN, antenna i receives:

$$Y_i(\omega)=X(\omega)H_{ji}(\omega)$$

This process is repeated until the matrix $H(\omega)$ is determined, which contains all of the transfer functions linking the two collections of transducers, for a specific configuration of the equivalent sources network ESN and the Field Synthesis Network FSN.

This process can then be reiterated several times to obtain transfer functions associated with the three principal polarizations x, y and z in a Cartesian frame of reference by changing the orientation of the elements of the equivalent sources network ESN during the measurement. This obtains three sets of transfer functions which are mutually orthogonal, $H_{ij\_x}(\omega)$, $H_{ij\_y}(\omega)$, $H_{ij\_z}(\omega)$, which constitute a base for generating these three principal polarizations and all linear combinations thereof.

It is now possible to create several types of attack, with the ability to choose its spatio-temporal distribution and polarization. However, the choice of directions of impact depends on the configuration chosen for the transducers 2-7. With a spherical configuration of the transducers 2-7 around the EUT, it is possible to envisage any type of attack along all possible directions through 360°.

In order to be able to set the parameters of the spatio-temporal field, two quantities are associated with the matrix H, i.e. a temporal signal x(t) (or X(ω) in the frequency domain), which defines the temporal changes in the wave front of the spatio-temporal field to impact on the equipment under test EUT, and the weightings $\alpha_j$, which mainly define the spatial changes in the wave front. The weightings $\alpha_j$, can be used to fix the direction and directivity of the wave front of the spatio-temporal field to strike the EUT.

The signal x(t) is defined with respect to the frequencies for which it is envisaged to attack the equipment under test EUT, thus it is mainly defined with respect to a pass band and a central frequency. Nonetheless, there is an infinite number of signals which share the same frequency occupancy. Therefore, the type of signal is also defined, for example whether it involves a Gaussian pulse or a rectangular or trapezoidal gate, etc.

The weightings $\alpha_j$ are defined on the basis of the following consideration: the wave front to be reconstructed by means of time reversal and directed towards the equipment under test EUT (across the surface identified by the equivalent sources network ESN) will have the same spatio-temporal characteristics as the wave front which would have been generated by the transducers of the equivalent sources network ESN, if these had been excited by the signal x(t) and weighted by the weightings $\alpha_j$. The only difference will be that, if the equivalent sources network ESN is emitting, the wave front will be propagated towards the outside (divergent), rather than (convergent) towards the equipment under test EUT. This consideration implies that the weightings $\alpha_j$ are chosen as a function of the wave front to be used to test the equipment under test EST, but they are not defined in the final usage configuration, but rather in a configuration where it would be the equivalent sources network ESN which was emitting the wave front in free space in the absence of the reverberant environment. This stage is then independent of the description phase and it can be performed using techniques of transducer network synthesis in free space.

As already seen, in order to be able to check the polarization of the wave front, it is necessary to measure the matrix H for different orientations of the transducers in the ESN. In this case, different sets of weightings $\alpha_j$ are to be considered, one set for each component of the polarization to be modified/excited.

Having described the environment and having fixed the excitation signal x(t) and the different sets of weightings $\alpha_j$, it is then possible to synthesize excitation signals $y_i(t)$, which are to be applied to the transducers in the FSN through the use of the following reversal formula:

$$y_i(t) = F^{-1}\left\{X^*(\omega)\sum_j \alpha_j^* H_{ij}^*(\omega)\right\}$$

where the star represents the complex conjugation operation, $X(\omega)$ and $H_{ij}(\omega)$ being defined in the frequency domain.

The operator $F^{-1}$ is the Fourier inverse transform (or, in an equivalent manner, that of Laplace).

Figure 2:
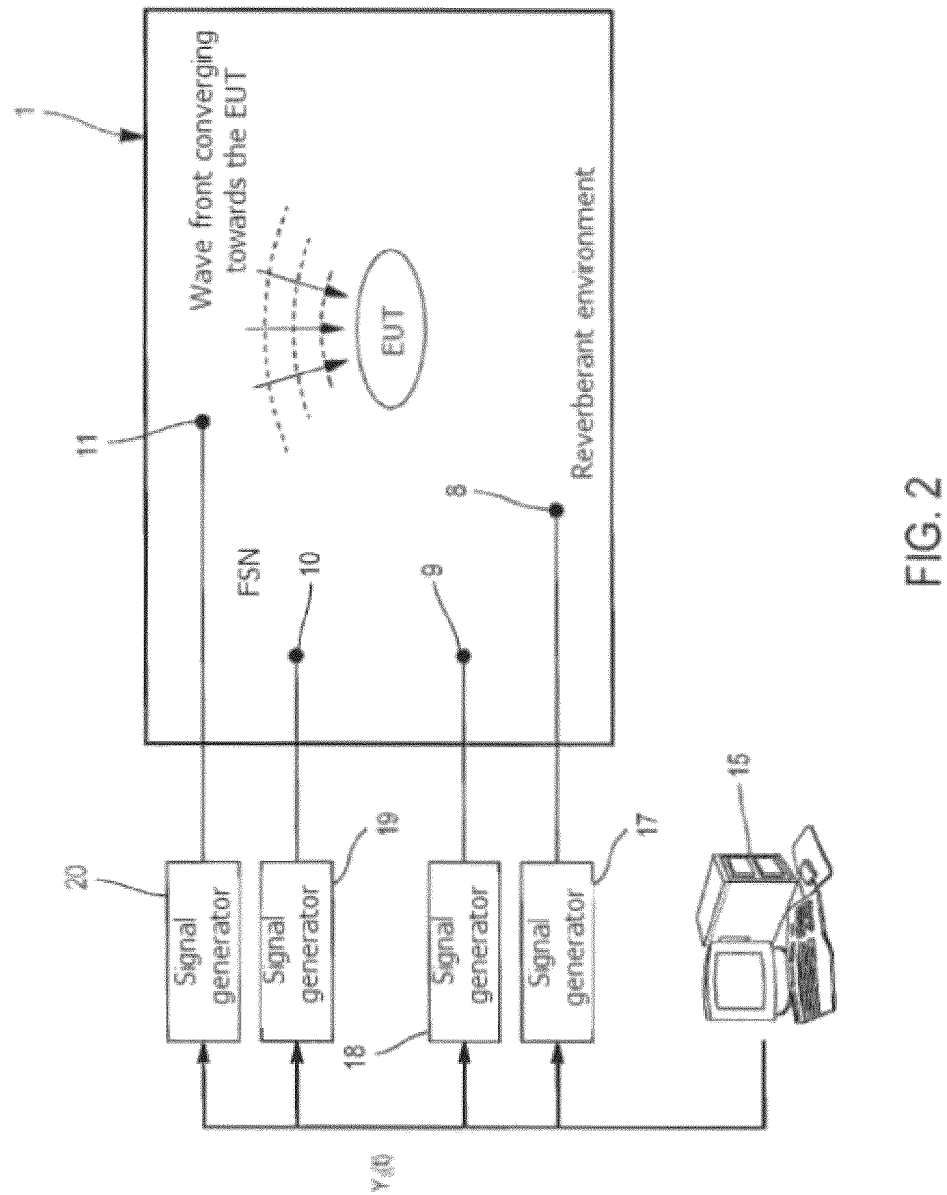
FIG. 2 is a simplified diagram of a measurement phase during which excitation signals are injected into transducers of the second group denoted Field Synthesis Network (FSN)
Figure 3:
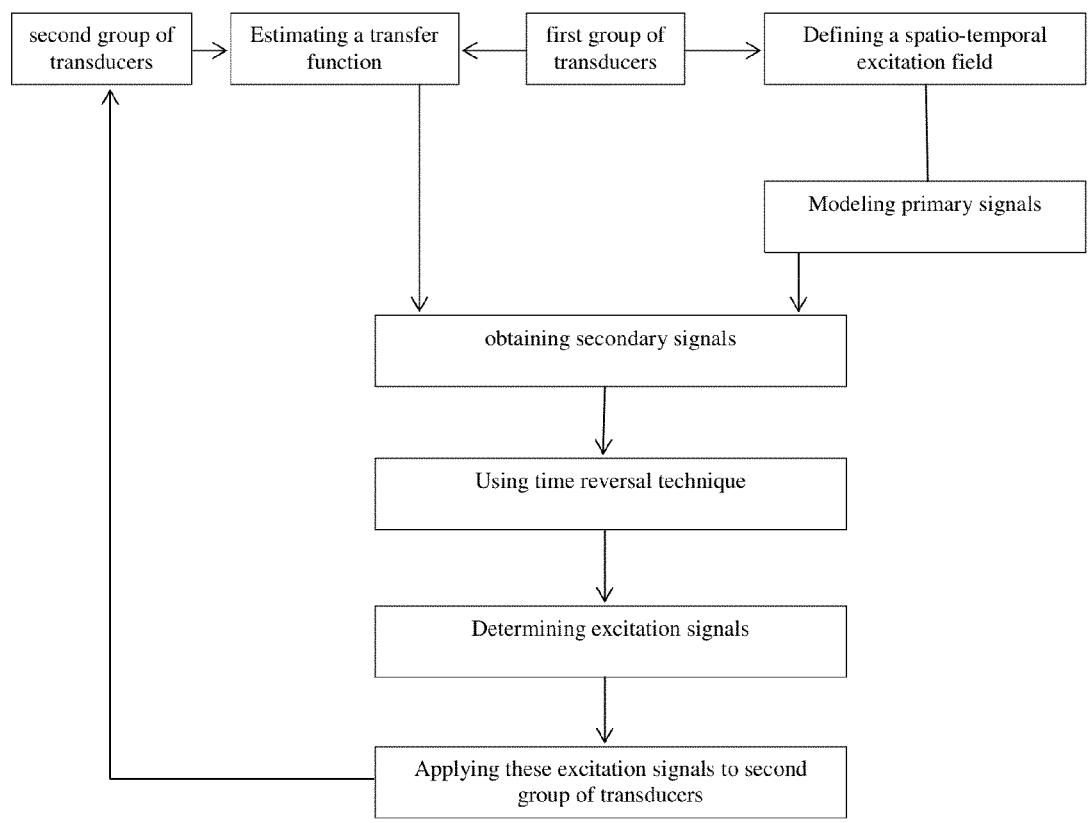
FIG. 3 is a block diagram illustrating the invention.

Apart from the reverberant environment characterization phase, all the other stages mentioned above are performed by digital processing using the computer 15 or using results calculated previously. Once the synthesis of the excitation signals $y_i(t)$ has been completed, they are applied to the transducers 8-11 in the field synthesis network FSN and generated in the temporal domain in accordance with FIG. 2. FIG. 2 shows the reverberant chamber 1 comprising the same elements as in FIG. 1, but the transducers 2-7 have been removed for the wave front generation phase. But it may be envisaged that they are left in the chamber. In this case, these transducers 2-7 are preferably chosen so as not to interfere with the excitation signal injection phase.

In order to generate the excitation signals $y_i(t)$, use is made, for each transducer in the field synthesis network FSN, of a generator 17, ..., 20 of arbitrary baseband wave forms by successively applying a modulation to offset the spectrum of the signal around the carrier (or central frequency) chosen during the determination of the primary signal x(t). There are other equivalent techniques, such as the use of an I/Q modulator. The signals thus injected into the reverberant environment reconstitute a coherent wave front which impacts on the equipment under test EUT with the direction, intensity, directivity and polarization as predefined by the x(t) and the weightings $\alpha_j$, see the arrows on FIG. 2.

Next, if a different wave front is to be generated, with a different spatial distribution, different temporal changes (signal x(t)) or a different polarization, it is sufficient to determine new excitation signals $y_i(t)$ on the basis of a new signal x(t) and new weightings $\alpha_j$, without any need to characterize the reverberant environment again. It is possible to test the equipment under test EUT with different directions of impact, polarization and temporal variations in very rapid succession. The main limitation is set by the speed of the computer which synthesizes the signals $y_i(t)$. The present invention thus makes it possible to check the properties of the spatio-temporal field in a reverberant enclosure in real time.

The present invention can advantageously be applied to tests for:
 electromagnetic susceptibility and/or immunity,
 efficacy of screening against radiated emissions,
 detection of non-linear effects or breakdown field test on an object subjected to a field, and
 determination of a radar cross-section (Acoustics and Electromagnetism).

Of course, the invention is not limited to the examples which have just been described and numerous adjustments can be made to these examples without exceeding the scope of the invention.

The invention claimed is:

1. A method for generating a spatio-temporal field in a reverberant environment in order to analyse behaviour of an object under test placed in the reverberant environment, said method comprising the following steps:
 estimating at least one transfer function between i) a first group of transducers comprising at least one transducer placed in the reverberant environment and ii) a second group of transducers comprising at least one transducer also placed in the reverberant environment;
 taking account of a spatial distribution of the transducers of the first group, selecting a spatio-temporal excitation field to be applied to the object under test;
 modeling primary signals which, when applied to the first group of transducers, obtains said selected spatio-temporal excitation field;

applying said at least one transfer function to the modeled primary signals to thereby obtain secondary signals;

determining excitation signals by applying i) a time reversal in time domain technique or ii) a phase conjugation in the frequency domain technique, on the obtained secondary signals; and obtaining said selected spatio-temporal excitation field by applying the determined excitation signals to the transducers of the second group, wherein said obtained spatio-temporal excitation field is a wave front propagating through the reverberant environment towards the object under test.

2. Method according to claim 1, wherein, in said modeling the primary signals step, each primary signal is defined in the form of $\alpha_j.X$, where X is the frequency spectrum of a signal as a function of the time variation ; $\alpha$ is a complex amplitude and phase weighting coefficient for the signal X, and j is an index denoting each transducer of the first group of transducers, the coefficients $\alpha$ being defined as a function of directivity, direction of arrival, polarization and/or intensity of the spatio-temporal excitation field.

3. Method according to claim 2, characterized in that the $\alpha_j$ are determined with a technique for synthesizing a network of transducers in free space.

4. Method according to claim 1, characterized in that, during the stage of estimation of at least one transfer function, two transfer functions are determined for respectively two different orthogonal orientations of said at least one transducer of the first group of transducers; the two orientations being tangent to a surface comprising all of the transducers of the first group of transducers; then, in the modeling stage, a linear combination of the two transfer functions is applied as a function of a desired polarization of the wave front of said spatio-temporal excitation field.

5. Method according to claim 1, characterized in that, during a first phase, three transfer functions are determined for respectively three different orthogonal orientations of said at least one transducer of the first group of transducers; then, in the modeling stage, a linear combination of the three transfer functions is applied as a function of a desired polarization of the wave front of said spatio-temporal excitation field.

6. Method according to claim 1, characterized in that the first group of transducers comprises a plurality of transducers positioned linearly.

7. Method according to claim 1, characterized in that the first group of transducers comprises a plurality of transducers positioned in a surface fashion.

8. Method according to claim 1, characterized in that the first group of transducers comprises a plurality of transducers positioned so as to constitute a volume around the object under test.

9. Method according to claim 1, characterized in that the transducers of the first group of transducers are electro-optical sensors.

10. Method according to claim 1, characterized in that the transducers of the first group of transducers are electro-acoustic sensors.

11. Method according to claim 1, characterized in that, during the stage of estimation of at least one transfer function, at least one transducer of the first group is used and moved into different positions and a component of said at least one transfer function is determined for each different position.

12. Method according to claim 1, characterized in that the estimation of said at least one transfer function is obtained in the frequency domain using a network analyzer.

13. Method according to claim 1, characterized in that the estimation of said at least one transfer function is obtained in the time domain using a function or arbitrary waveform generator and an oscilloscope.

14. The method of claim 1, wherein,
in said step of determining the excitation signals, the time reversal in time domain technique is applied on the obtained secondary signals, and
the wave front is an electromagnetic wave front.

15. The method of claim 1, wherein the transducers of the first group are electro-acoustic sensors, and the wave front is an acoustic wave front.

16. A method for generating a spatio-temporal field in a reverberant environment in order to analyse behaviour of an object under test placed in the reverberant environment, said method comprising the following steps:
describing the reverberant environment by estimating a transfer function between i) a first group of transducers with a first distribution in the reverberant environment, the first group of transducers defining an Equivalent Source Network (ESN) with a surface corresponding to the first distribution in the reverberant environment, the Equivalent Source Network (ESN) emulating radiation of a point source at the center of the object under test, and ii) a second group of transducers which define a Field Synthesis Network (FSN) arranged in the reverberant environment;
taking account of a spatial distribution of the transducers of the first group, selecting a spatio-temporal excitation field to be applied to the object under test;
in order to obtain the selected spatio-temporal excitation field, modeling a primary signal which, when applied to the first group of transducers, obtain said selected spatio-temporal excitation field, the primary signal being a single signal with a different weighting on each transducer of the first group;
obtaining secondary signals by applying said estimated transfer function to the primary signal;
determining excitation signals by applying one of the group consisting of i) time reversal in time domain technique and ii) a phase conjugation in the frequency domain technique, on the obtained secondary signals; and
obtaining said selected spatio-temporal excitation field by applying the determined excitation signals to the second group of transducers, said obtained spatio-temporal excitation field being a wave front propagating through the reverberant environment towards the object under test.

17. The method of claim 16, wherein in said step of determining the excitation signals, the time reversal in time domain technique is applied on the obtained secondary signals, said obtained selected spatio-temporal excitation field is weighted individual for each transducer of the second group of transducers, and the obtained spatio-temporal excitation field converges towards the object under test.

18. The method of claim 16, wherein, in said modeling the primary signals step, each primary signal is defined in a form of $\alpha_j.X$, where
X is a frequency spectrum of a signal as a function of time variation,
$\alpha$ is a complex amplitude and phase weighting coefficient for the signal X, and
j is an index denoting each transducer of the first group of transducers, the coefficients $\alpha$ being defined as a function of directivity, direction of arrival, polarization and/or intensity of the spatio-temporal excitation field.

19. The method of claim 16, wherein the wave front is an electromagnetic wave front.

20. The method of claim 16, wherein the transducers of the first group are electro-acoustic sensors, and the wave front is an acoustic wave front.

* * * * *